(12) United States Patent
Wang

(10) Patent No.: US 7,152,481 B2
(45) Date of Patent: Dec. 26, 2006

(54) CAPACITIVE MICROMACHINED ACOUSTIC TRANSDUCER

(76) Inventor: Yunlong Wang, 47667 Gridley Ct., Fremont, CA (US) 94539

( * ) Notice: Subject to any disclaimer, the term of this patent is extended or adjusted under 35 U.S.C. 154(b) by 66 days.

(21) Appl. No.: 10/907,706

(22) Filed: Apr. 13, 2005

(65) Prior Publication Data

US 2006/0233401 A1   Oct. 19, 2006

(51) Int. Cl.
   *H04R 25/00* (2006.01)
(52) U.S. Cl. .................................... 73/718; 381/176
(58) Field of Classification Search ............. 73/700, 73/718, 724; 381/177, 176
   See application file for complete search history.

(56) References Cited

U.S. PATENT DOCUMENTS

| | | | | |
|---|---|---|---|---|
| 4,377,951 A | * | 3/1983 | Magg et al. | .............. 74/473.28 |
| 5,146,435 A | | 9/1992 | Bernstein | |
| 5,452,268 A | | 9/1995 | Bernstein | |
| 5,619,476 A | | 4/1997 | Haller et al. | |
| 5,748,758 A | * | 5/1998 | Menasco et al. | ............. 381/176 |
| 5,870,351 A | | 2/1999 | Ladabaum et al. | |
| 5,894,452 A | | 4/1999 | Ladabaum et al. | |
| 6,028,389 A | * | 2/2000 | Bernstein | ..................... 310/324 |
| 6,035,052 A | * | 3/2000 | Fujihira et al. | ............. 381/401 |
| 6,075,866 A | * | 6/2000 | Frasl et al. | ................. 381/177 |
| 6,493,288 B1 | | 12/2002 | Khuri-Yakub et al. | |
| 6,535,460 B1 | | 3/2003 | Loeppert et al. | |
| 6,535,612 B1 | * | 3/2003 | Croft et al. | ................. 381/191 |
| 6,847,090 B1 | | 1/2005 | Loeppert | |
| 6,870,937 B1 | | 3/2005 | Hirosaki et al. | |
| 6,945,115 B1 | * | 9/2005 | Wang | ........................ 73/718 |

* cited by examiner

*Primary Examiner*—Edward Lefkowitz
*Assistant Examiner*—Andre Allen

(57) ABSTRACT

A micromachined capacitive acoustic transducer including an electrode formed by a perforated plate and another electrode formed by a shallowly corrugated membrane anchored at one or more positions on the substrate which also supports the said perforated plate is described. Also disclosed includes: a fixed perforated plate; a movable shallowly corrugated membrane having holes to form acoustic filter to a certain frequency or a range of frequencies spaced from the perforated plate that is anchored in one or more location but loose at other locations; a support structure in the perforated plate maintaining the minimum separation between the membrane and the perforated plate near the perimeter.

15 Claims, 7 Drawing Sheets

CAPACITIVE MICROMACHINED ACOUSTIC TRANSDUCER

CROSS REFERENCE TO RELATED APPLICATION

U.S. Pat. No.: 5,146,435; 5,452,268; 5,619,476; 5,870,351; 5,894,452; 6,493,288; 6,535,460; 6,847,090; 6,870,937.

BACKGROUND OF THE INVENTION

The batch processing of micromachining has led to the emergence of capacitive micromachined transducers. These transducers offer a larger set of parameters for optimization of performance as well as ease of fabrication and electronic integration. The fabrication and operation of micromachined transducers have been described in many publications and patents. For example, U.S. Pat. Nos. 5,619,476, 5,870,351, 5,894,452 and 6,493,288 describe the fabrication of capacitive-type ultrasonic transducers. U.S. Pat. Nos. 5,146,435; 5,452,268, and 6,870,937 also describe micromachined capacitive transducers that are mainly used in the audio range for sound pickups. In most structures, the movable diaphragm of a micromachined transducer is either supported by a substrate or insulative supports such as silicon nitride, silicon oxide and polyamide. The supports engage the edge of membrane, and a voltage is applied between the substrate and a conductive film on the surface of the membrane causes the membrane to vibrate in response to the passing sound waves. In one particular case as described in the U.S. Pat. No. 6,535,460, the diaphragm is suspended to allow it rest freely on the support rings.

Many micromachined condenser microphones use a similar membrane structure to that of large measurement microphones and studio recording microphones. One common structure, shown in FIG. 1, consists of a conductive membrane 1 suspended over a conductive back-plate 5 that is perforated with acoustic holes 3. Sound detection is possible when the impinging pressure wave vibrates the membrane 1, thus changing the capacitance of the transducer 2. Under normal operation, the change in capacitance of the condenser microphone 2 is detected by measuring the output current 8 under constant-voltage bias. A pressure equalization vent 4 in the back-chamber 7 prevents fluctuations in atmospheric pressure from collapsing the membrane 1 against the back-plate 5. A precision condenser microphone for measurement or calibration applications is capable of a uniform frequency response due to its relatively large air gap, on the order of 20 µm, behind the membrane. Silicon micromachined microphones, with membrane dimensions of 1–2 mm, require air gaps 6 on the order of a few microns to maintain adequate sensitivity due to the reduced motion that results from a smaller membrane. However, the reduced dimensions of the air gap magnify the effects of squeeze-film damping, introducing frequency-dependent stiffness and loss. This creates undesirable variations in the mechanical response with acoustic frequency. Furthermore, achieving a large dynamic range and a high sensitivity can be conflicting goals, since large sound pressures may cause the membrane to collapse under its voltage bias. This traditional approach suffers from low sensitivity, especially at low frequencies.

In order to achieve wide bandwidth and high sensitivity, the development of high-performance diaphragm is of vital importance in the successful realization of condenser microphones. For most very thin diaphragms, however, large residual stress can lead to undesirable effects such as low and irreproducible performances, if the processes cannot accurately be controlled. One technique for acquiring low-stress diaphragms is to use a sandwich structure, in which layers with compressive and tensile stress are combined. Another technique is to use the support structure such as outlined in the U.S. Pat. No. 6,847,090. U.S. Pat. No. 6,535,460 also describes a structure that the membrane is freely suspended to allow it release the mechanical stress. Unfortunately, in this case, the freely suspended membrane will have unstable sensitivity and unwanted lateral movement, resulting in the signal spew and posing the reliability issues.

SUMMARY OF THE INVENTION

It is an object of the present invention to provide a micromachined acoustic transducer with micromachined capacitive elements for sensing acoustic waves.

It is a further object of the present invention to provide a micromachined acoustic transducer that comprises a perforated plate supported above a substrate.

It is another object of the present invention to provide a micromachined acoustic transducer that has shallowly corrugated membrane that is suspended above a substrate.

It is a further object of the present invention to provide a micromachined acoustic transducer whose suspended and shallowly corrugated membrane is anchored on the substrate at one or more locations.

It is another object of the present invention to provide a micromachined acoustic transducer that has wide bandwidth and high sensitivity, yet its operation is stable and reliable.

It is a further object of the present invention to provide a micromachined acoustic transducer that features the mechanism to suppress the unwanted rolling noise at audio band.

It is another object of the present invention to provide a micromachined acoustic transducer that has the shallowly corrugated structures that further provide relatively stable sensitivity.

The foregoing and other objects of the invention are achieved by a micromachined acoustic transducer including a perforated plate supported above a substrate, a shallowly corrugated membrane that is suspended above the said substrate and the said suspended shallowly corrugated membrane is anchored on the said substrate at one or more locations. Each membrane supports a conductive electrode for movement therewith, whereby each perforated plate forms a capacitor with the conductive electrode. The capacitance of the said capacitor varies with movement of the membrane responsive to the acoustic wave. Conductive lines interconnect said conductive electrodes to provide output signals.

BRIEF DESCRIPTION OF THE DRAWINGS

The foregoing and other objects of the invention will be more clearly understood from the following description when read in conjunction with the accompanying drawings of which.

DESCRIPTION OF THE PREFFERRED EMBODIMENTS

We approach the problem of making a good and practical micromachined acoustic transducer from a different perspective. Our stress releasing technique is to form corrugations in the membrane. The corrugated membrane is capable of releasing the built-in stress during the processing, thereby increasing the mechanical sensitivity of the membrane and reducing the irreproducibility. Compared with the conventional flat diaphragm, the shallowly corrugated membrane has an increased sensitivity, especially for a high residual stress level.

Figure 1:
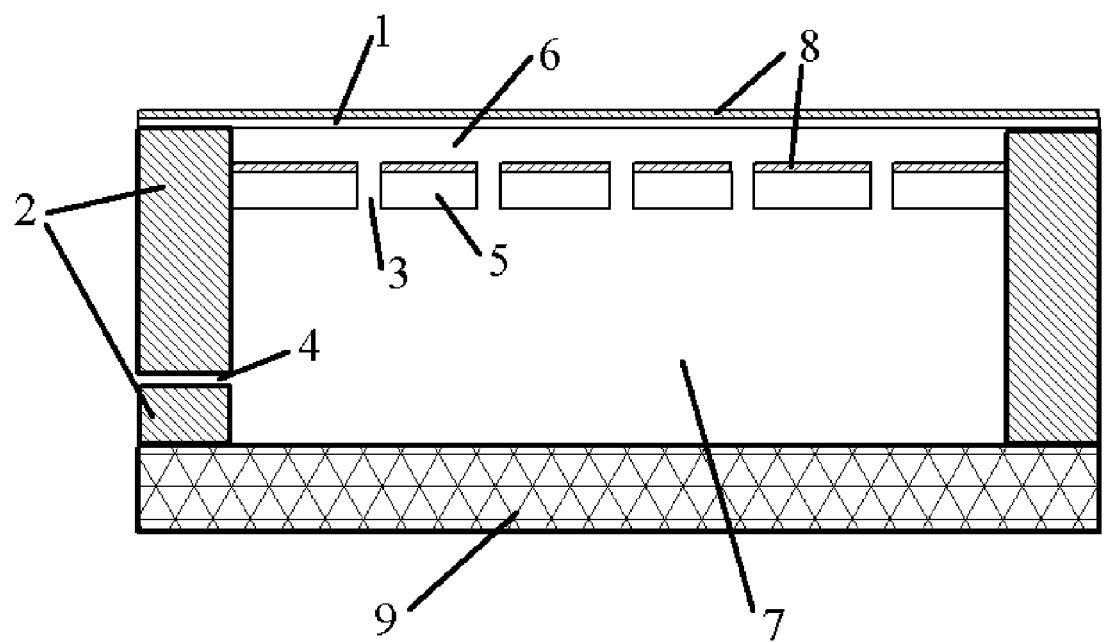
FIG. 1 is a cross-sectional view of a typical traditionally micromachined microphone.
Figure 2:
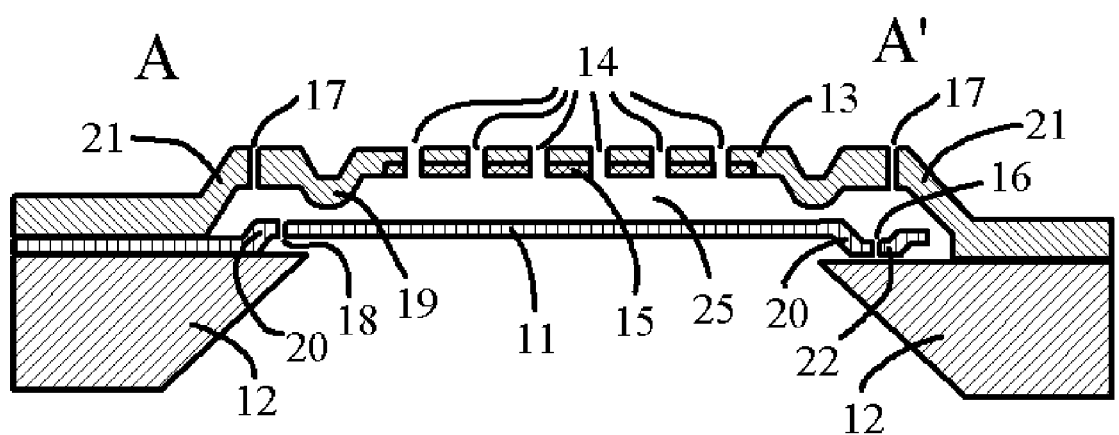
FIG. 2 shows a cross-sectional view of a micromachined acoustic transducer along the line A–A' in FIG. 4 according to the preferred embodiment of the present invention.
Figure 3:
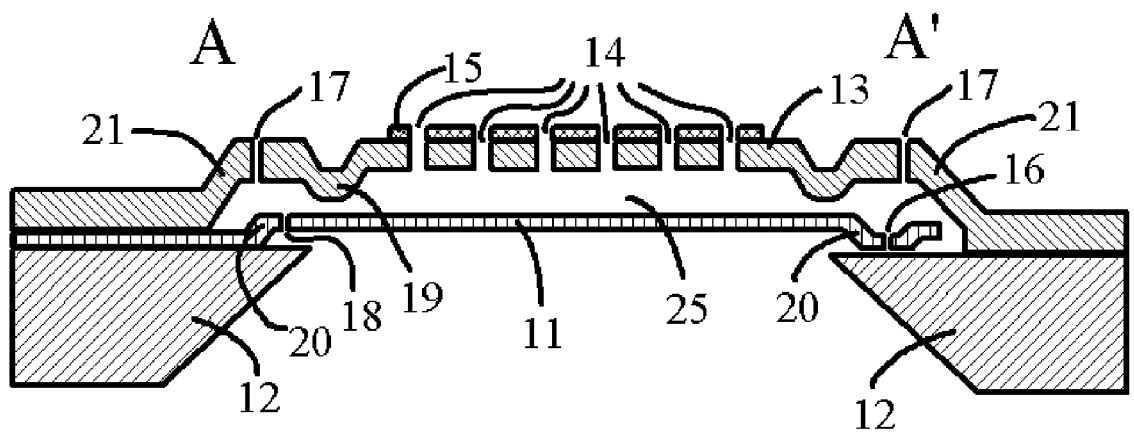
FIG. 3 shows a cross-sectional view of a micromachined acoustic transducer along the line A–A' in FIG. 4 according to another preferred embodiment of the present invention.
Figure 4:
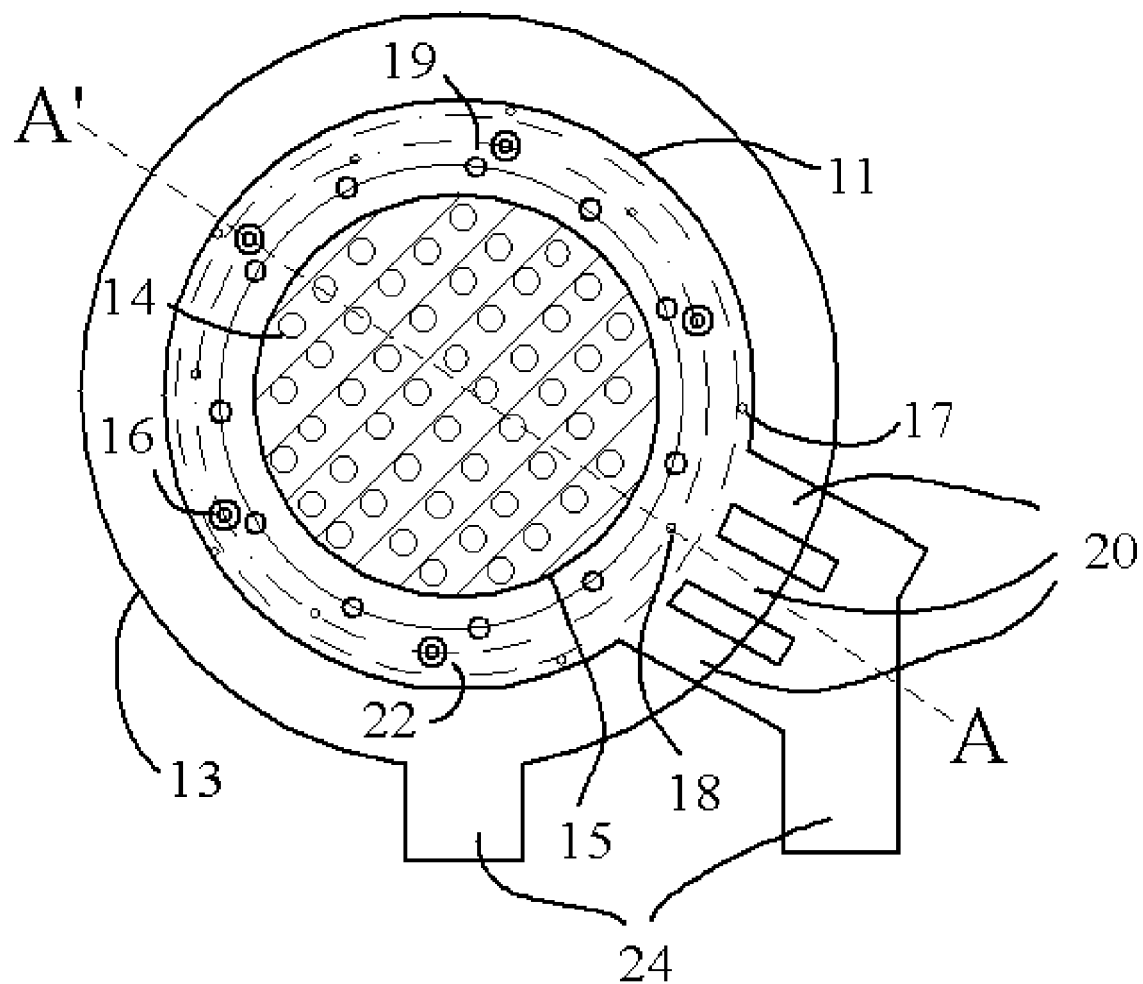
FIG. 4 shows a top plan view of a micromachined acoustic transducer according to the preferred embodiment of the present invention.

Referring now to FIG. 2, this is a cross-sectional view of a micromachined acoustic transducer along the line A–A' in FIG. 4 according to the preferred embodiment of the present invention. A shallowly corrugated membrane 11 is anchored at one end on the substrate 12, and loose at the other end. The built-in stress in the membrane 11 is released through corrugation 20 on the membrane 11. The built-in stress in membrane 11 is further release through the loose end 22 on membrane 11. A perforated plate 13 is supported on the substrate 12 through anchor 21. Perforation holes 14 are regular distributed on the plate 13 to allow the passage of acoustic wave. An air gap 25 is formed between the perforated plate 13 and membrane 11. On the back of perforated plate 13, electrode 15 forms a capacitor with the membrane 11. When acoustic wave passes through the perforation holes 14, the membrane 11 will vibrate in response to the acoustic wave, thereby generating changing capacitance in the capacitor formed by perforated plate 13 and membrane 11. The electrode 15 can also be placed on top of the perforated plate 13, as shown in FIG. 3.

Holes 17 and 18 are formed by the photolithography process. The size of these holes and their relative positions are chosen such that they will form a low-pass filter that allows the passage of slowly varying ambient pressure change across the stack of membrane 11, air gap 25 and perforated plate 13. But it will stop the leakage of acoustic signal at desired frequency. Holes 16 are also formed in the photolithography process to help release the sacrificial material under membrane end 22. On perforated plate 13, there are a series of spacers 19. They protects the membrane 11 from collapsing into the perforated plate 13 while in operation in which the membrane 11 will be pulled towards the perforated plate 13 when applied with bias voltage across them. Spacers 19 are discontinuous, but they can also be made continuous to form a ring type structure.

Figure 5:
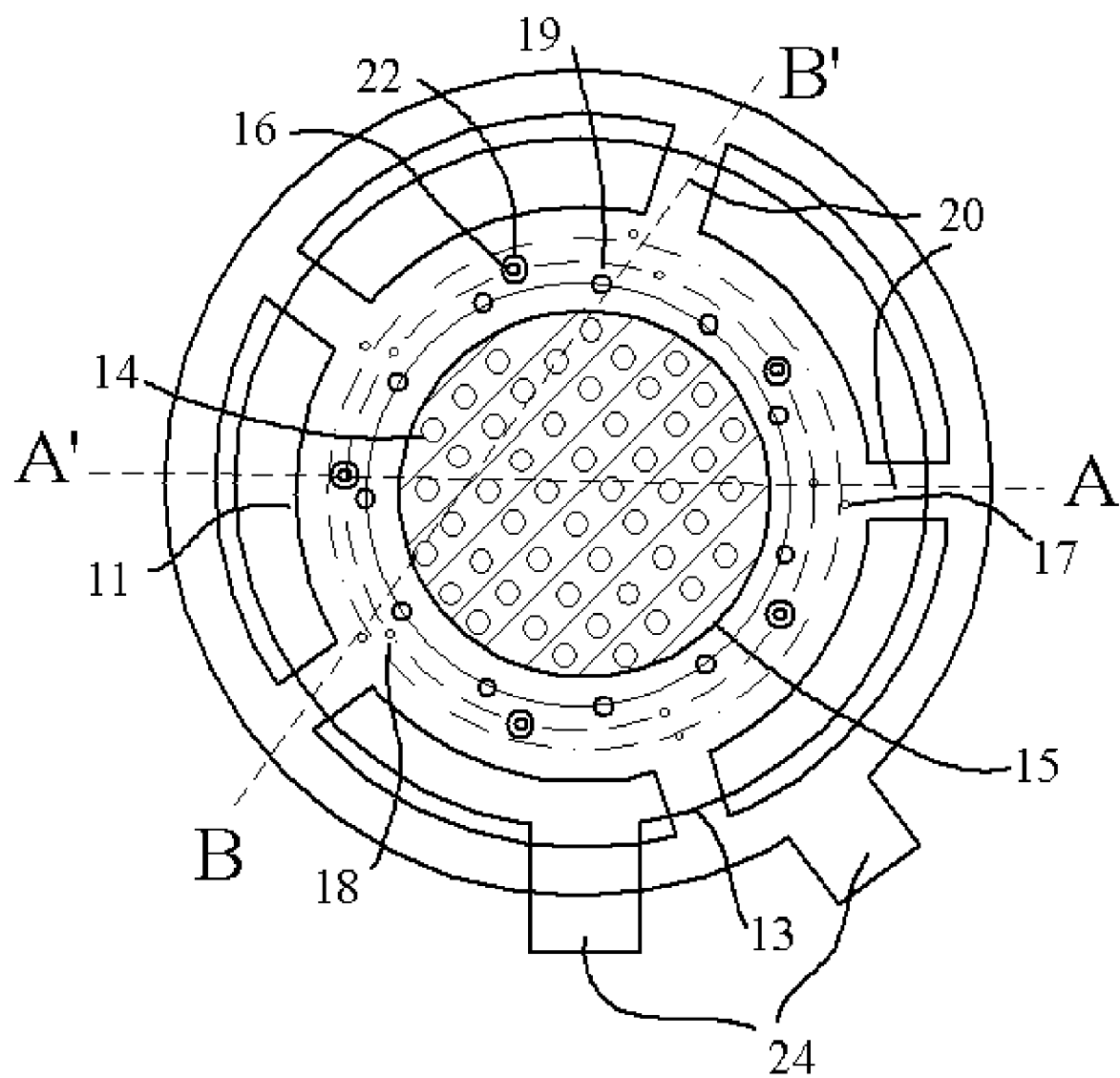
FIG. 5 shows a top plan view of a micromachined acoustic transducer according to another preferred embodiment of the present invention.

Referring to FIGS. 4 and 5, membrane 11 is anchored on to the substrate 12 at one or more positions. If it is anchored at the positions shown in FIG. 4, it will essentially form a turning fork structure. In another preferred embodiment according to this invention, the membrane 11 is anchored to the substrate 12 at many locations, as shown in FIG. 5. Contact pads 24 are used to wire the external circuit to the said micromachined acoustic transducer.

Figure 6:
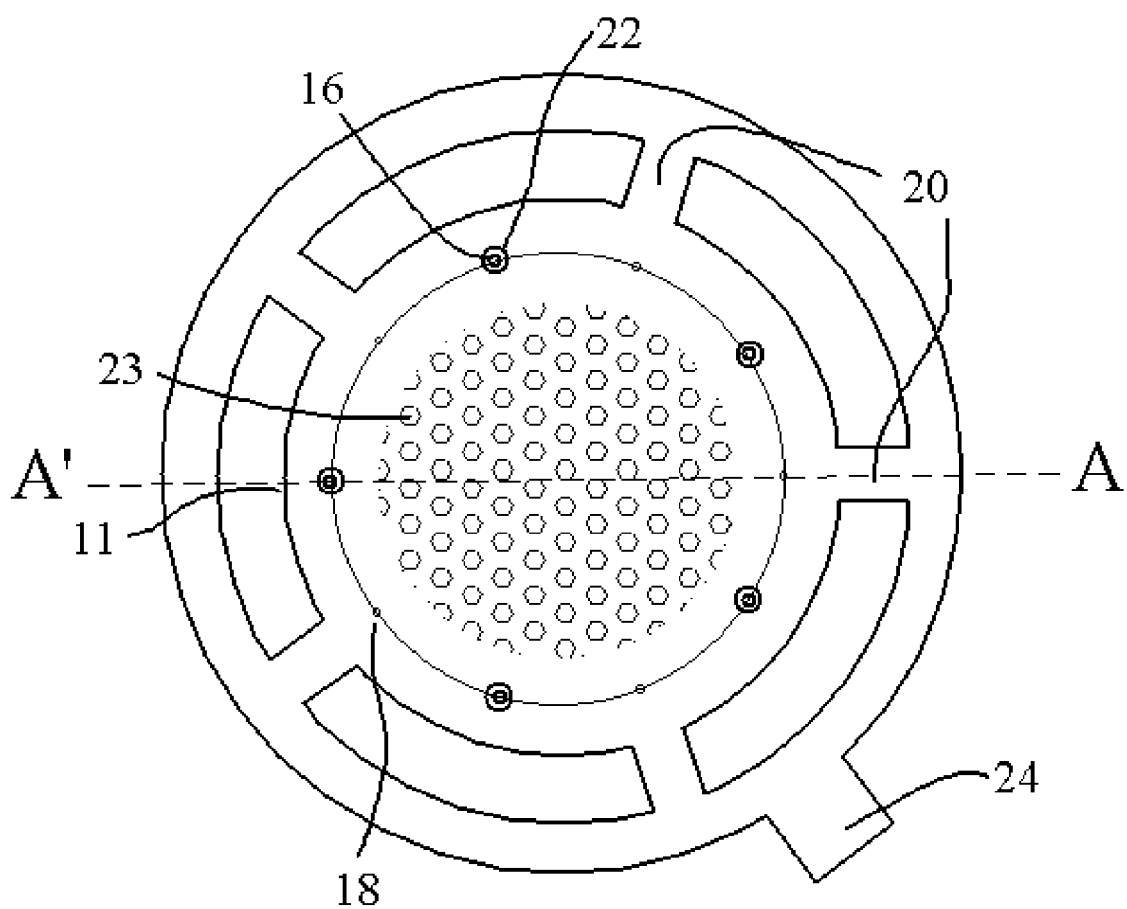
FIG. 6 shows a top plan view of a shallowly corrugated membrane according to another preferred embodiment of the present invention.

FIG. 6 shows the top view of the membrane 11. At the center region of the membrane 11, there may exist some holes 23. These holes are defined to form acoustic filter to a certain frequency or a range of frequencies. The size of holes 23 may be uniform, non-uniform, or a spread according to the filtering needs. The length of corrugation 20 also varies depends on the desired sensitivity requirement. When a suitable length of corrugation 20 is achieved, the membrane 11 may be resting on the spacers 19 under bias voltage applied across the capacitor formed by membrane 11 and perforated plate 13. In this case, the bending rigidity of the membrane 11 may be largely reduced because the active region of the membrane 11 will be those bounded by the spacers 19. This essentially reduces "equivalent thickness" of the membrane 11 due to corrugation 20.

Figure 7:
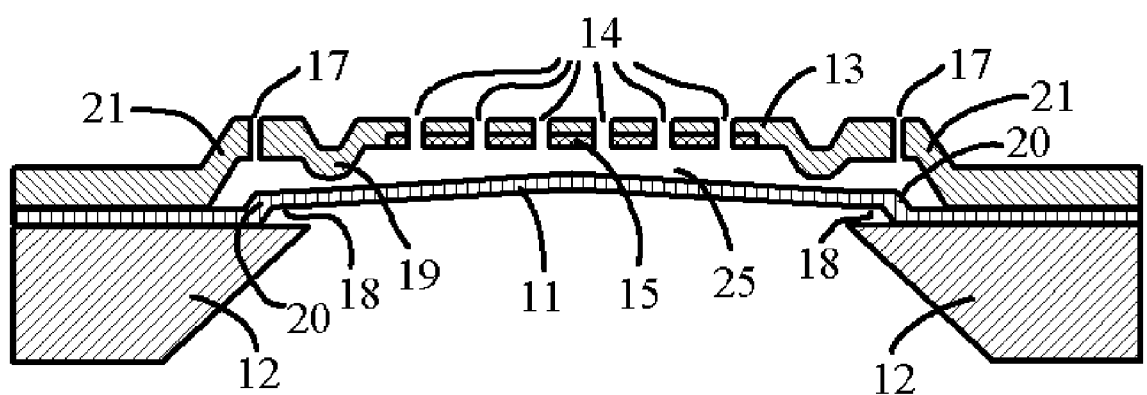
FIG. 7 shows an angled cross-sectional view of a micromachined acoustic transducer when in operation along the lines A–A' and B–B' in FIG. 4 according to the preferred embodiment of the present invention.

For a condenser microphone, the measured sensitivity can be expressed as:

$$\text{Sensitivity} \propto \frac{a^2}{8 \cdot \sigma \cdot h} \cdot \frac{V_b}{d - d_{V_b}}$$

Where a is the radius of membrane 11, $\sigma$ is the residual stress in membrane 11, h the thickness of membrane 11, d the air gap 25 distance, and $d_{V_b}$ is the change of air gap 25 distance under bias voltage $V_b$. When the bias voltage $V_b$ increases, the sensitivity of the microphone also increases. In most of the applications, this is not the desired results. And therefore, the alternative is to increase the bending stress in membrane 11 when the bias voltage increases. Referring to FIG. 7, which is the cross sectional view of line BB' in FIG. 5. When in operation, the membrane 11 will be pulled to bend towards the perforated plate 13. Increasing the bias voltage will result in the membrane 11 bending further. Since the membrane 11 is anchored, further bending of membrane 11 from its desired operation state will result in the increase of bending stress. This will then compensate the sensitivity increase due to the rise of bias voltage.

The foregoing descriptions of specific embodiments of the present invention are presented for the purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A micromachined miniature acoustic transducer including
   a capacitor formed by a perforated plate and a membrane; the perforated plate having well defined perforation holes that serves as one electrode of the capacitor;
   a shallowly corrugated membrane that is anchored at one or more locations to form another electrode of the said capacitor; the length of corrugation for the said membrane is predetermined based on the desired sensitivity requirement;

a substrate on which the said membrane and the said perforated plate are anchored; and the said membrane having an anchoring structure that forms a tuning fork with the said perforated plate.

2. A micromachined miniature acoustic transducer as in claim 1 in which the said perforated plate has a plurality of spacers that define the minimum separation of the said membrane from the said perorated plate.

3. A micromachined miniature acoustic transducer as in claim 1 in which the said membrane is shallowly corrugated; the said membrane is further anchored onto the said substrate at one or more locations.

4. A micromachined miniature acoustic transducer as in claim 1 in which the said membrane is loosely supported on the said substrate at positions where the said membrane is not anchored onto the said substrate.

5. A micromachined miniature acoustic transducer as in claim 1 in which the said membrane and the said perforated plate having pre-defined through holes that are arranged in combination to form a low-pass filter for passage of slow varying ambient pressure.

6. A micromachined miniature acoustic transducer including a capacitor formed by a perforated plate and a membrane;

the perforated plate having well defined perforation holes that serves as one electrode of the said capacitor;

a shallowly corrugated membrane that is anchored at one or more locations to form another electrode of the said capacitor; the length of corrugation for the said membrane is predetermined based on the desired sensitivity requirement;

a substrate on which the said membrane and the said perforated plate are anchored; and the said membrane is anchored onto the said substrate in such a way that the bending stress increases with the bias voltage, thereby maintaining the relative stable sensitivity.

7. A micromachined miniature acoustic transducer as in claim 6 in which the said perforated plate has a plurality of spacers that define the minimum separation of the said membrane from the said perorated plate.

8. A micromachined miniature acoustic transducer as in claim 6 in which the said membrane is shallowly corrugated; the said membrane is further anchored onto the said substrate at one or more locations.

9. A micromachined miniature acoustic transducer as in claim 6 in which the said membrane is loosely supported on the said substrate at positions where the said membrane is not anchored onto the said substrate.

10. A micromachined miniature acoustic transducer as in claim 6 in which the said membrane and the said perforated plate having pre-defined through holes that are arranged in combination to form a low-pass filter for passage of slow varying ambient pressure.

11. A micromachined miniature acoustic transducer including a capacitor formed by a perforated plate and a membrane;

the perforated plate having well defined perforation holes that serves as one electrode of the said capacitor;

a shallowly corrugated membrane that is anchored at one or more locations to form another electrode of the said capacitor; the length of corrugation for the said membrane is predetermined based on the desired sensitivity requirement;

a substrate on which the said membrane and the said perforated plate are anchored; and the said membrane has holes that are defined to form acoustic filter to a certain frequency or a range of frequencies; the size of holes is uniform, non-uniform, or a spread according to the filtering needs.

12. A micromachined miniature acoustic transducer as in claim 11 in which the said perforated plate has a plurality of spacers that define the minimum separation of the said membrane from the said perorated plate.

13. A micromachined miniature acoustic transducer as in claim 11 in which the said membrane is shallowly corrugated; the said membrane is further anchored onto the said substrate at one or more locations.

14. A micromachined miniature acoustic transducer as in claim 11 in which the said membrane is loosely supported on the said substrate at positions where the said membrane is not anchored onto the said substrate.

15. A micromachined miniature acoustic transducer as in claim 11 in which the said membrane and the said perforated plate having pre-defined through holes that are arranged in combination to form a low-pass filter for passage of slow varying ambient pressure.

* * * * *